(12) United States Patent
Deng et al.

(10) Patent No.: US 6,573,549 B1
(45) Date of Patent: Jun. 3, 2003

(54) DYNAMIC THRESHOLD VOLTAGE 6T SRAM CELL

(75) Inventors: Xiaowei Deng, Plano, TX (US); Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/177,773

(22) Filed: Jun. 21, 2002

(51) Int. Cl.[7] ............................................. H01L 27/08
(52) U.S. Cl. ...................................................... 257/296
(58) Field of Search ......................... 257/296; 365/165, 365/154, 176, 216

(56) References Cited

U.S. PATENT DOCUMENTS 5,943,258 A  8/1999  Houston et al.
6,091,654 A  * 7/2000  Forbes et al.

* cited by examiner

*Primary Examiner*—Fetsum Abraham
(74) *Attorney, Agent, or Firm*—Jacqueline J. Garner; W. James Brady, III; Frederick J. Telecky, Jr.

(57) ABSTRACT

An embodiment of the instant invention is a memory device comprising: a memory cell including: a first transistor (108 of FIG. 1) having a control electrode, a current path, and a backgate/body connection electrically connected to the control electrode of the first transistor; and a second transistor (130 of FIG. 1) having a control electrode, a current path, and a backgate/body connection electrically connected to the control electrode of the second transistor and the current path of the first transistor, the current path of the second transistor connected to the backgate/body connection of the first transistor; an input/output conductor; and a pass transistor coupling the memory cell to the input/output conductor.

7 Claims, 6 Drawing Sheets

DYNAMIC THRESHOLD VOLTAGE 6T SRAM CELL

CROSS-REFERENCE TO RELATED PATENT/PATENT APPLICATIONS

The following commonly assigned patent/patent applications are hereby incorporated herein by reference:

| Patent No./Ser. No. | Filing Date |
|---|---|
| 10/178,063 | 06/21/02 |

FIELD OF THE INVENTION

The instant invention pertains to semiconductor devices, fabrication and processing and more specifically to a static random access memory cell.

BACKGROUND OF THE INVENTION

Semiconductor memories are vital components for mainframe and personal computers, telecommunications, automotive and consumer electronics, and commercial and military avionics systems. Semiconductor memories are characterized as volatile random access memories (RAMs) or nonvolatile devices. RAMs can either be static mode (SRAMs) where digital information is stored by setting the logic state of a bistable device, or dynamic mode (DRAMs) where digital information is stored through periodic charging of a capacitor. SRAM is typically arranged as a matrix of memory cells fabricated in an integrated circuit chip, and address decoding functions in the chip allow access to each cell for read/write functions. SRAM memory cells use active feedback in the form of cross-coupled inverters to store a bit of information as a logical "0" or a logical "1". The active elements in the memory cells need a constant source of power to remain latched in the desired state. The memory cells are often arranged in rows so that blocks of data such as words or bytes can be written or read simultaneously. Address multiplexing is used to reduce the number of input and output pins. SRAMs have undergone dramatic increases in density in the past several years.

Standard SRAM memory cells have many variations. The basic CMOS SRAM cell consists of two n-channel pull-down (or "drive") transistors and two p-channel load transistors in a cross-coupled inverter configuration, with two n-channel select transistors added to make up a six-transistor cell. Polysilicon load resistors have been used instead of PMOS transistors to reduce the cell size. Furthermore, there are application-specific variations of the basic SRAM cell. Application-specific SRAMs include extra logic circuitry to make them compatible for a specific task. For instance, an eight-transistor, double-ended, dual-port cell can be accessed through both ports and is useful in cache architectures embedded in memory of a microprocessor. A nine transistor content-addressable memory cell is used in applications where both the contents and location of the cell must be known.

In each application, there is a need to not only reduce the total area needed to make an effective and reliable SRAM cell, but also to increase access speed while reducing the power consumed by the SRAM cells. Power can be reduced by lowering the supply voltage. However, both speed and stability are degraded with lower supply voltages. Hence, a need has arisen for a low power (low operating voltage) SRAM cell which has increased access speed and good stability.

SUMMARY OF THE INVENTION

An embodiment of the instant invention is a memory device comprising: a memory cell including: a first transistor having a control electrode, a current path, and a backgate/body connection electrically connected to the control electrode of the first transistor; and a second transistor having a control electrode, a current path, and a backgate/body connection electrically connected to the control electrode of the second transistor and the current path of the first transistor, the current path of the second transistor connected to the backgate/body connection of the first transistor; an input/output conductor; and a pass transistor coupling the memory cell to the input/output conductor. In an alternative embodiment, the memory cell further includes: a third transistor having a control electrode and a current path electrically connected to the current path of the first transistor and the backgate/body connection and control electrode of the second transistor, the control electrode of the third transistor electrically connected to the current path of the second transistor and the control electrode and backgate/body connection of the first transistor; and a fourth transistor having a control electrode and a current path electrically connected to the current path of the second transistor, the control electrode of the third transistor, and the backgate/body connection and the control electrode of the first transistor, the control electrode of the fourth transistor electrically connected to the current path of the first transistor, the current path of the third transistor, and the control electrode and the backgate/body connection of the second transistor. In another alternative embodiment, the backgate/body of the first transistor is electrically connected to the control electrode of the first transistor by a first diode (preferably a Schottky diode), and the backgate/body of the transistor is electrically connected to the control electrode of the second transistor by a second diode (preferably a Schottky diode).

BRIEF DESCRIPTION OF THE DRAWINGS

FIG. 2 illustrates a possible cell layout in a silicon-on-insulator (SOI) process.

FIG. 3b is a cross-sectional view of a partially fabricated device of an embodiment of the instant invention wherein FIG. 3b is taken along the A'–A' line of FIG. 3a. FIGS. 3a and 3b illustrate a possible cell layout implemented in an SOI process.

FIG. 4b is a cross-sectional view of a partially fabricated device of an embodiment of the instant invention wherein FIG. 4b is taken along the A'–A' line of FIG. 4a. FIGS. 4a and 4b illustrate a possible cell layout implemented in a bulk CMOS process.

FIG. 6b is a cross-sectional view of a partially fabricated device of an embodiment of the instant invention wherein FIG. 6b is taken,along the A'–A' line of FIG. 6a. FIGS. 6a and 6b illustrate a possible cell layout implemented in an SOI process.

FIG. 7b is a cross-sectional view of a partially fabricated device of an embodiment of the instant invention wherein FIG. 7b is taken along the A'–A' line of FIG. 7a. FIGS. 7a and 7b illustrate a possible cell layout implemented in a bulk CMOS process.

Similar reference numerals are used throughout the figures to designate like or equivalent features. The figures are not drawn to scale. They are merely provided to illustrate the affect of the method of the instant invention.

DETAILED DESCRIPTION OF THE DRAWINGS

Figure 1:
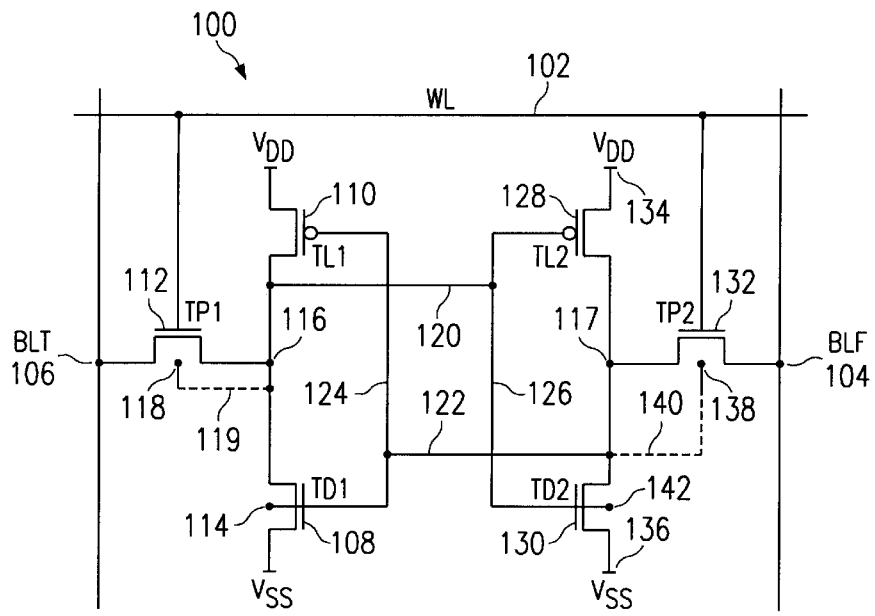
FIG. 1 is a circuit diagram of the SRAM cell of one embodiment of the instant invention. The cell in FIG. 1 is preferable for operation at a supply voltage of around 0.6 volt or less.

The SRAM cell of the instant invention is illustrated schematically in FIG. 1. The cell in FIG. 1 is preferable for operation at a supply voltage of around 0.6 volt or less. While transistors 110 and 128 are illustrated as pMOS devices and transistors 108, 112, 130 and 132 are illustrated as nMOS devices, these transistors can be nMOS and pMOS, respectively. However, if these modifications are made, different biasing conditions would, preferably, be used, and the diffusion regions in the figures would need to be formed with dopants of the opposite conductivity type. In addition, the schematic and layouts illustrated in FIGS. 2, 3a–3b, 4a–4b, 5, 6a–6b, and 7a–7b are merely provided as illustrations of possible variations of the cell schematic and possible layout implementations of various cell designs. The cell in FIG. 5 has a maximum body-to-source voltage of a supply voltage less a diode voltage drop, hence is preferable for operation at a supply voltage above around 0.6 volt. More or less optimal schematics and layouts should become obvious to one of ordinary skill in the art based on the instant specification and drawings. Different configurations of the cell, including various body/backgate connections, should become obvious to one of ordinary skill in the art based on the instant teachings.

The SRAM cell 100 of the instant invention utilizes the body connection (in a SOI configuration) or a well connection (in a bulk silicon configuration) so as to adjust the threshold voltage ($V_\tau$) of the nMOS and/or pMOS transistors of the SRAM cell 100. A backgate connection can be used with a double gate transistor. These different specific connections are referred to as a body connection in the following text. A high body voltage results in a low $V_\tau$ for nMOS devices and a high $V_\tau$ for pMOS devices. Likewise, a low body voltage results in a high $V_\tau$ for nMOS devices and a low $V_\tau$ for pMOS devices. Preferably, the body to source junction is not forward biased by more than approximately 0.75 V (or more preferably by not more than 0.6 V): The variation in $V_\tau$ resulting from the variation in body voltage is preferably about 0.1 V or more. With respect to the drive transistors 108 and 130, higher drive current is preferable during the read operation because it causes the memory cell to be more stable. However, during the standby mode (or store mode), the leakage current is preferably low so as to reduce standby power. The body/backgate connections of the instant invention allow for these two conditions to be more readily met.

Figure 2:
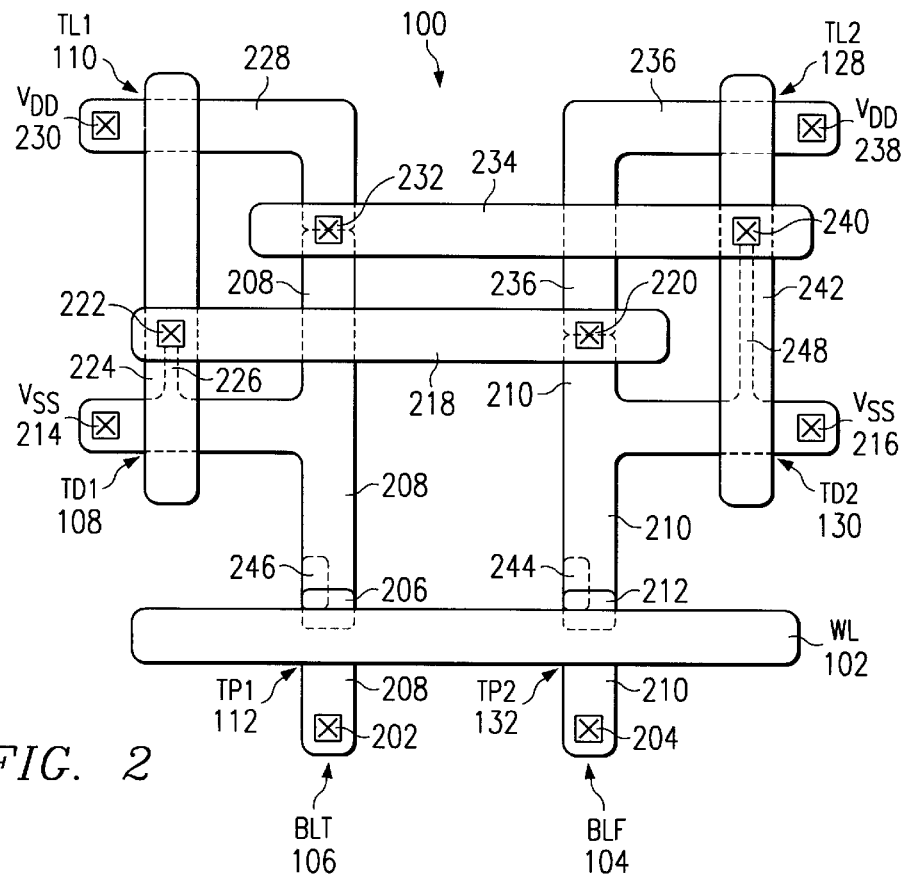
FIG. 2 is a plan view of the SRAM cell of an embodiment of the instant invention as is depicted in FIG. 1.

Referring to FIGS. 1 and 2, the SRAM cell 100 uses two input/output lines which are commonly referred to as bit-lines. The two lines allow a symmetrical write of a '1' and a '0', along with a read without upset.

The storage cell of the instant invention is configured such that the side that is storing a logic "1" level will have the nMOS driver transistor biased to have a high $V_\tau$ and the nMOS pass transistor to have a low $V_\tau$. On the side which is storing a logic "0" value, the nMOS drive transistor will be biased to distribution of the $V_\tau$'s improves the bi-stability, read and write speeds, and standby power leakage current.

In standby or precharge conditions, BLT 106 and BLF 104 are both kept at a high level, and the wordline (WL) 102 is left at a logic "0" level. During a read operation the WL 102 is switched to a logic "1" value (preferably less than 1 volt; more preferably less than 0.75 volts; even more preferably less than 0.7 volts; and most preferably around 0.6 volts or less). Both BLT 106 and BLF 104 start at a logic "1" value. However, if a logic "1" is stored in the cell (node 116 high and node 117 low), BLF 104 will be pulled low relative to BLT. For this case (storage of a "1") transistor 132 has a relatively high $V_\tau$ and transistor 112 has a relatively low Vt, resulting in higher stability.

During a write operation, WL 102 is switched to a logic "1" level and one or the other of BLT 106 and BLF 104 is switched from the precharge high level to a low level. For example, to write a '0', BLT is switched low. For this case, the current through transistor 112 will pull node 116 (also labeled 120) low. The relative strengths of transistors 112 and 110 are designed such that node 116 will be pulled low enough that node 117 goes high, latching the '0' state in the cell. For the case where the cell was originally storing a '1' (node 116 high), the original body bias condition on transistor 112 causes a low $V_\tau$, facilitating the write process.

FIG. 2 illustrates a possible layout scheme for the SRAM cell of the instant invention. In this implementation, WL 102 is, preferably, implemented using doped polycrystalline silicon ("poly" or "polysilicon"), which may or may not be silicided, or one or two metals which is either a midgap material or ones that have workfunctions similar to p-type and n-type poly. These metals may include: Ti, TiN, Ta, TaN, W, tungsten nitride, or any other metal which is commonly used to form gate structures. The WL 102 also forms the gates to pass transistor 112 and pass transistor 132, which is the reason why the material used to form WL 102 needs to be carefully chosen. Contacts 202 and 204 connect n-type diffusion regions 208 and 210 to BLT 106 and BLF 104, respectively.

Conductor 218 forms line 122 of FIG. 1, and conductor 234 forms line 120 of FIG. 1. Connections 218 and 234 are, preferably, comprised of a metal (preferably copper, aluminum, tungsten, titanium, titanium nitride, tantalum, tantalum nitride, a stack of any of the above, or a combination thereof) or silicided poly. Contact 222 connects conductor 218 to underlying conductive structure 274. Preferably, conductive structure 224 is comprised of doped poly, which may or may not be silicided (preferably with either cobalt or titanium), or one or two metals which is either a midgap material or ones that have workfunctions similar to p-type and n-type poly. These metals may include: Ti, TiN, Ta, TaN, W, tungsten nitride, or any other metal which is commonly used to form gate structures. Conductive structure 224 forms the gate to drive transistor 108 and the gate to load transistor 110. Contact 214 connects n-type diffusion 208 to the $V_{SS}$ power supply (which is preferably at or around ground level). Diffusion region 226, if formed at all, forms a connection from body/backgate connection 114 to line 122. This connection may or may not be formed, if it is the connection of backgate/body connection 142 to line 120 is also, preferably, formed.

Contact 220 connects conductor 218 to p-type diffusion region 236 (which is the drain of load transistor 128) and n-type diffusion region 210 (which is the source region of drive transistor 130). Contact 220 may be formed right at the junction of region 210 and 236 so as to make connection to both (as is shown in FIG. 2), or, if these regions are silicided, contact 220 may be formed anywhere along the silicided region.

Contact 240 connects conductor 234 to conductor 242, which forms the gate to drive transistor 130 and the gate to load transistor 128. Preferably, conductor 242 is comprised of doped poly, which may or may not be silicided (preferably with either cobalt or titanium), or one or two metals which is either a midgap material or ones that have workfunctions similar to p-type and n-type poly. These metals may include: Ti, TiN, Ta, TaN, W, tungsten nitride, or any other metal which is commonly used to form gate structures. Contact 232 connects conductor 234 to p-type diffusion region 228 (which is the drain of load transistor 110) and n-type diffusion region 208 (which is the source region of drive transistor 108). Contact 232 may be formed right at the junction of region 208 and 228 so as to make connection to both (as is shown in FIG. 2), or, if these regions are silicided, contact 232 may be formed anywhere along the silicided region.

Contacts 214 and 216 provide connections to the $V_{SS}$ supply and contacts 230 and 238 provide connections to $V_{DD}$ (which is preferably less than 1 volt; more preferably less than 0.75 volts; even more preferably less than 0.7 volts; and most preferably around or less than 0.6 volts). Contact 240, along with diffused regions 248 provide the body/backgate connection for drive transistor 130, if it is formed at all. Diffused regions 206 and 212 provide the optional connection between the body/backgate connections 118 and 138 to the sources of pass transistors 112 and 132, respectively. Diffused regions 246 and 244 provide the backgate/body connections for transistors 112 and 132, respectively. The SRAM cell of the instant invention utilizes the body/backgate connections in pairs, but does not require that all of the pairs have to be connected. For example, if body/backgate connection 118 is tied to its source then body/backgate connection 138 would preferably connected to its source, but the body/backgate connections to load transistors 110 and 134 and body/backgate connections 114 and 142 do not have to be tied to anything for the cell of the instant invention to work properly.

Features in the embodiments of the instant invention which are illustrated in FIGS. 3a–3b, 4a–4b, 5, 6a–6b, and 7a–7b which have the same reference numeral are like or similar features. However, the backgate connections in the figures which represent devices formed on and in a silicon substrate have the same reference numeral as the body connections in the figures which represent devices formed in an SOI structure. While these are not exactly the same features, they are still given the same reference numeral. The same is true for these regions in FIGS. 6a–6b and 7a–7b where Schottky diodes are formed. One of ordinary skill in the art will be able to discern these differences based on the instant recitations and the figures. The following description of the embodiments of the instant invention which are illustrated in FIGS. 3a–3b, 4a–4b, 5, 6a–6b, and 7a–7b will not redescribe features described above, unless further clarification is necessary.

Substrate 300 may be fabricated from single-crystal silicon which may be doped to be p-type or n-type, or it may be comprised of an epitaxial silicon layer (which is preferably doped to be p-type and/or n-type) formed on a single-crystal silicon substrate. The SOI structures of the embodiments of FIGS. 3a–3b and 6a–6b is preferably comprised of a silicon layer formed on a silicon dioxide layer, which is formed on a silicon substrate. This structure may be formed using any conventional SOI body formation process.

In light of the teachings and recitations of the instant invention, several additional embodiments should seem obvious to one of ordinary skill in the art. For example, while isolation regions 304 are illustrated as shallow trench isolation structures, any type of isolation structure (such as LOCOS, field oxide regions, or doped isolation structures) can be used to fabricate the devices of the instant invention. In addition, while the doped regions and polycrystalline silicon structures are silicided (preferably using titanium silicide, cobalt silicide, tungsten silicide, or tantalum silicide), these structures do not have to be silicide. The silicide is preferably because it reduces the resistance of these structures in addition to facilitating the placement of interconnects and contacts because they can be placed anywhere along the silicided structure (and not necessarily at the junction of two doped regions, for example).

Figure 3A:
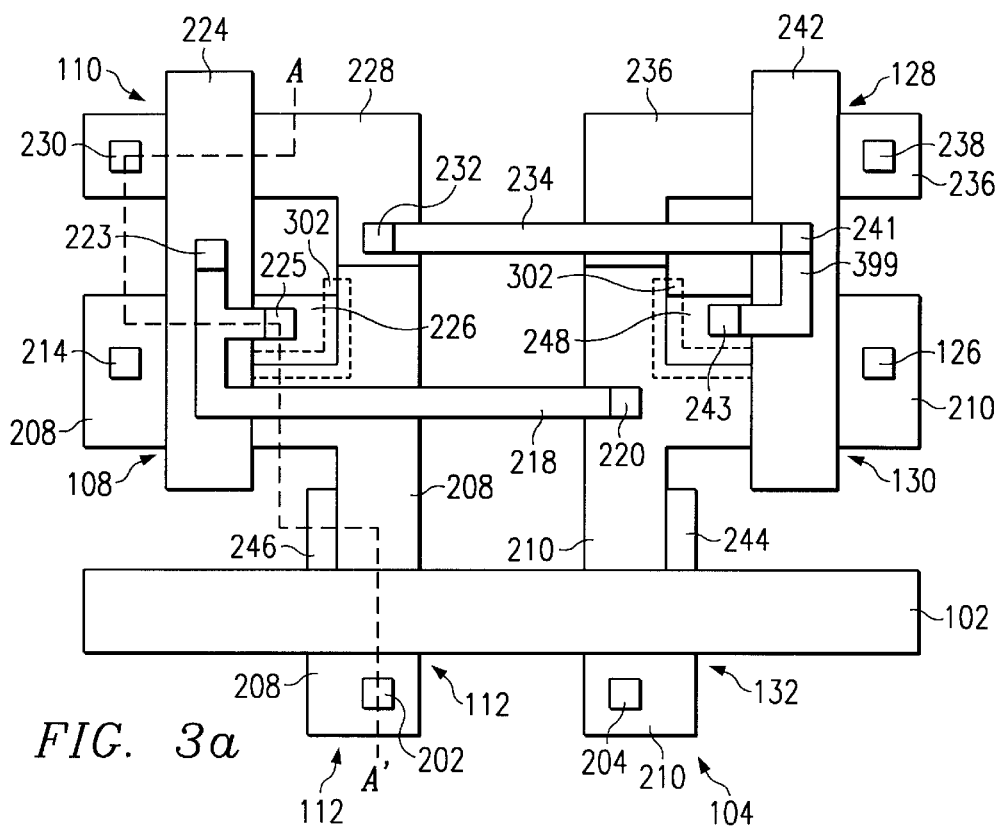
FIG. 3a is a plan view of the SRAM cell of an embodiment of the instant invention as is depicted in FIG. 1.
Figure 3B:
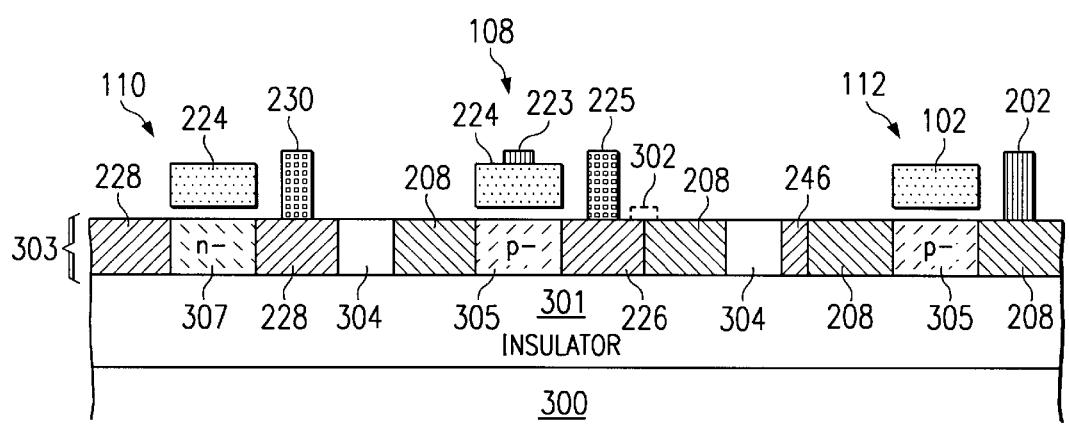
Figure 3B:
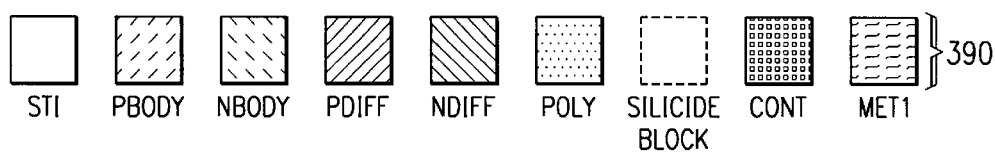

Referring to the embodiment of FIGS. 3a–3b, conductors 218 and 234 have been altered from the embodiment of FIG. 2 so as to provide alternative body connections. For example, conductor 399 has been connected to conductor 234 so as to facilitate connections to these different body connections. In addition, additional contacts 225, 223, 241, and 243 are illustrated so as to interconnect doped body connections 226 and 248 to gate lines 224 and 242, respectively. Furthermore, body connections 246 and 244 are formed in a fashion different than that of FIG. 2.

FIG. 3b illustrates the SOI body structure which is comprised of silicon substrate 300, insulating layer 301, and silicon layer 303 (which is preferably comprised of single-crystal silicon or epitaxial silicon—which can be doped to be n-type, p-type, both, or a having a portion of each type). Body regions 305 and 307 form the channel regions of the gate structures. As can be seen in the preferred materials list 390 (at the bottom of the figures), regions 305 is preferably a lightly doped p-type region and region 307 is a lightly doped n-type region. Regions 305 and 307 are, preferably, formed by doping layer 303 either as it is formed or after it is formed but prior to forming the gate structures (i.e. the gate electrode, underlying gate insulator, and insulating sidewalls).

Figure 5:
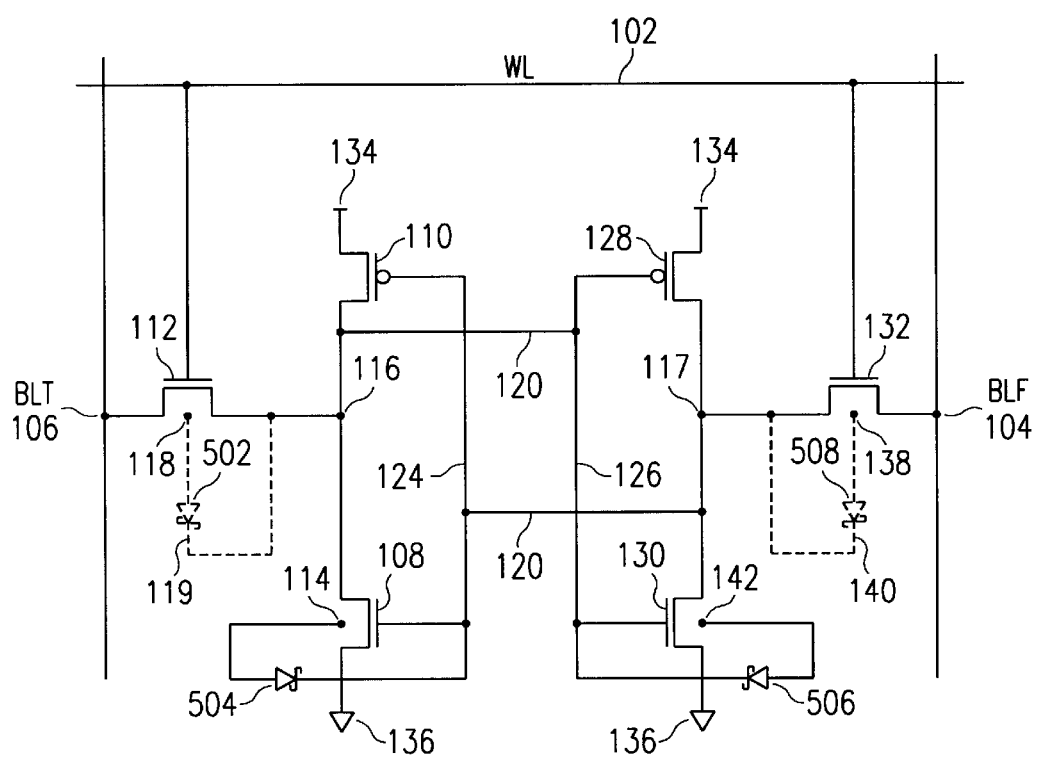
FIG. 5 is a circuit diagram of the SRAM cell of another embodiment of the instant invention. The cell in FIG. 5 is preferable for operation at a supply voltage above around 0.6 volt.
Figure 6A:
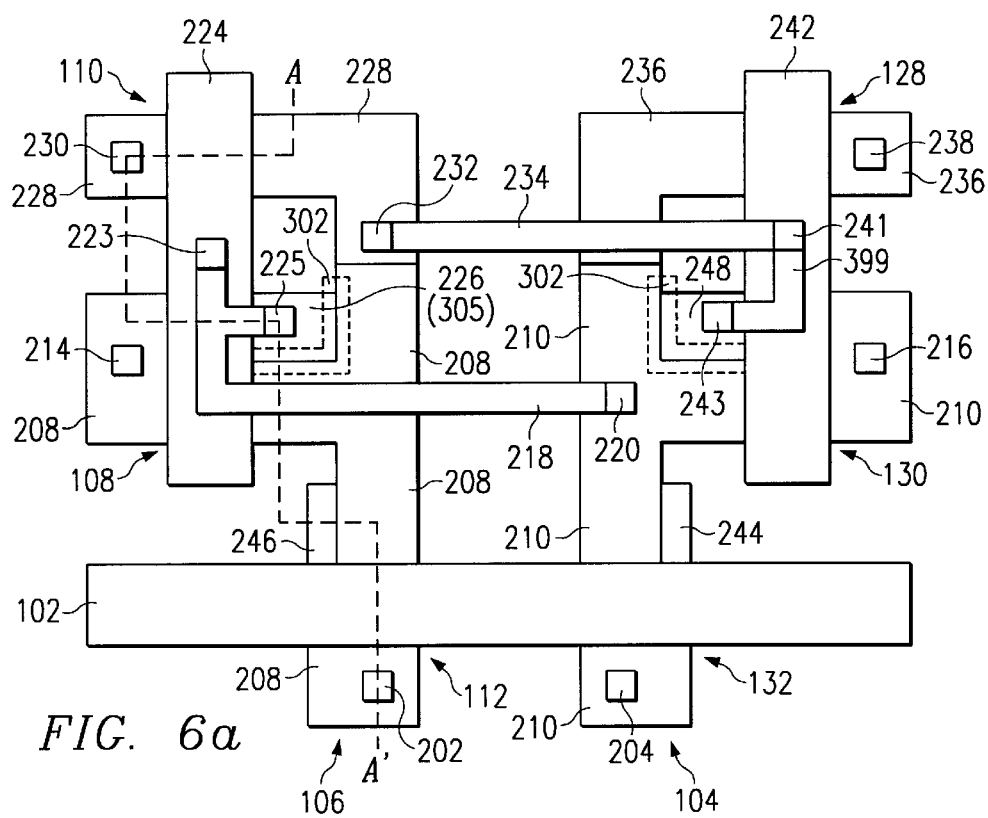
FIG. 6a is a plan view of the SRAM cell of an embodiment of the instant invention as is depicted in FIG. 5.
Figure 6B:
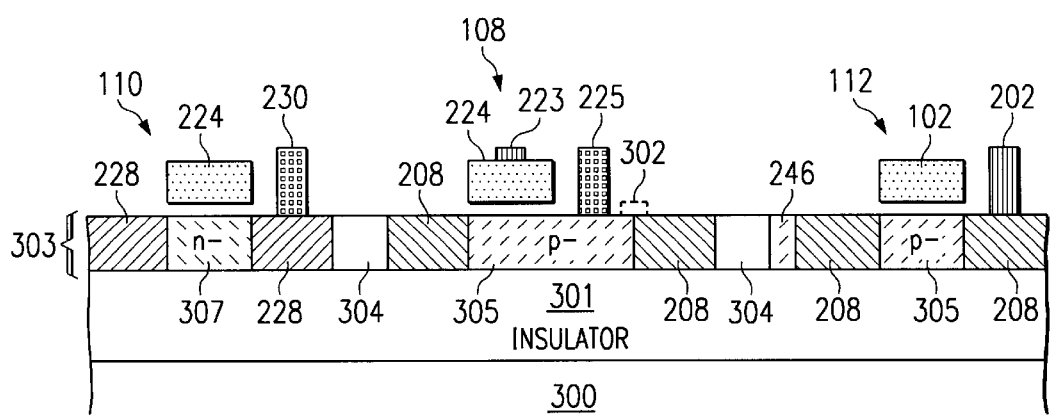
Figure 6B:
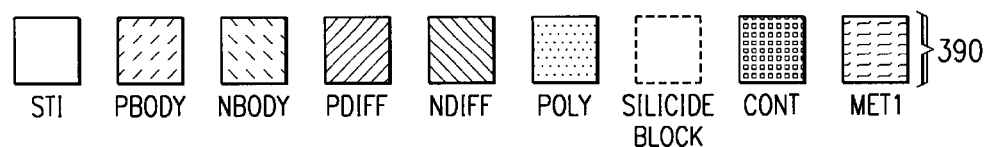

The embodiment of the instant invention as is illustrated in FIGS. 6a and 6b is similar to that of FIGS. 3a and 3b, except for the formation of Schottky diodes 502 (optional), 504, 506, and 508 (optional) in the embodiments of FIGS. 6a and 6b. In other words, the embodiment of FIGS. 3a and 3b form direct connections from the backgate/body portion to the other conductive lines. However, in the embodiment of FIGS. 6a and 6b, these connections are made through a Schottky diode (as is illustrated in FIG. 5). The formation of these diodes should, basically, just affect the doping levels (and possibly the dopant used and silicide formation) for regions 244, 246, 226, and 248. An example of this difference can be seen in FIG. 6b. Instead of having contact 225 connect to p-type diffusion 226 as is shown in FIG. 3b, the embodiment of FIG. 6b utilizes the p-type body 305 to connect to so as to form the Schottky diode. The rest of the structures should be the same.

Figure 4A:
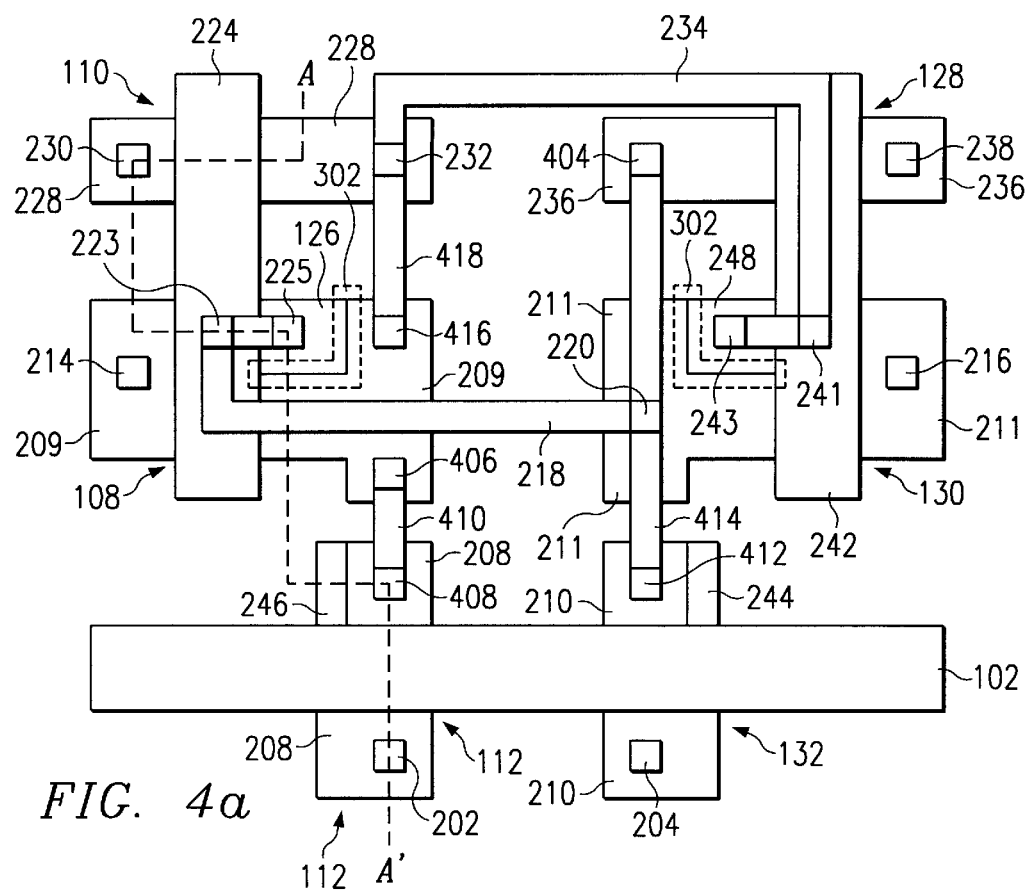
FIG. 4a is a plan view of the SRAM cell of an embodiment of the instant invention as is depicted in FIG. 1.
Figure 4B:
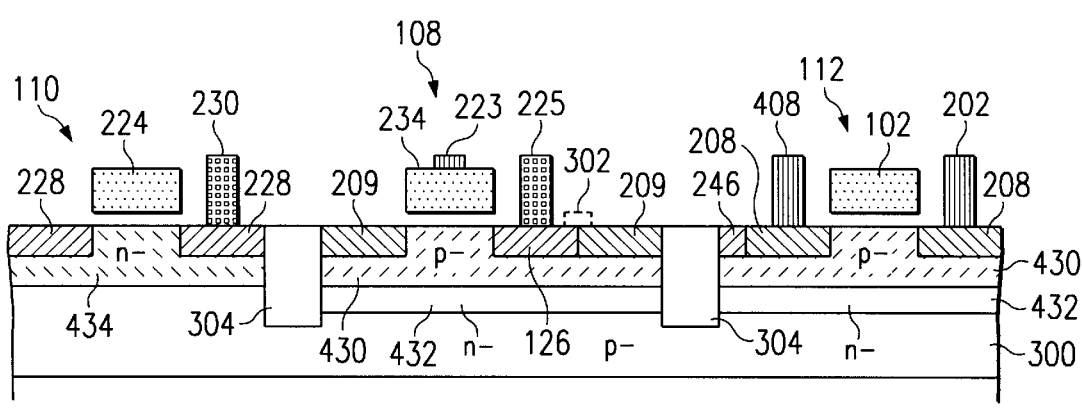
Figure 4B:
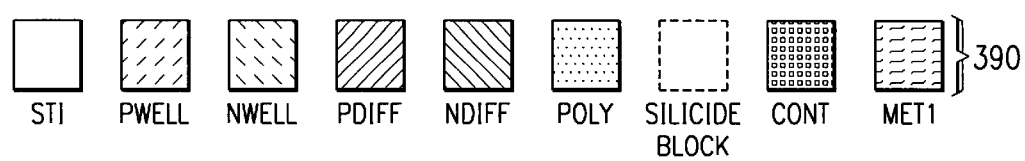
Figure 7A:
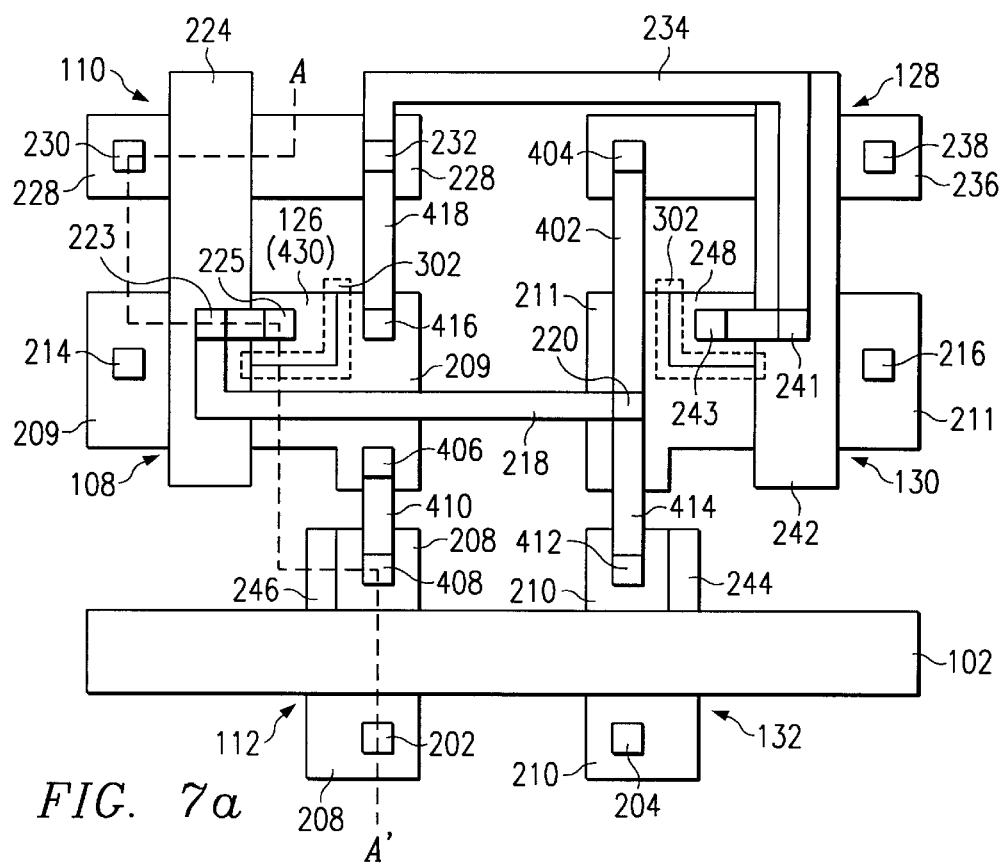
FIG. 7a is a plan view of the SRAM cell of an embodiment of the instant invention as is depicted in FIG. 5.
Figure 7B:
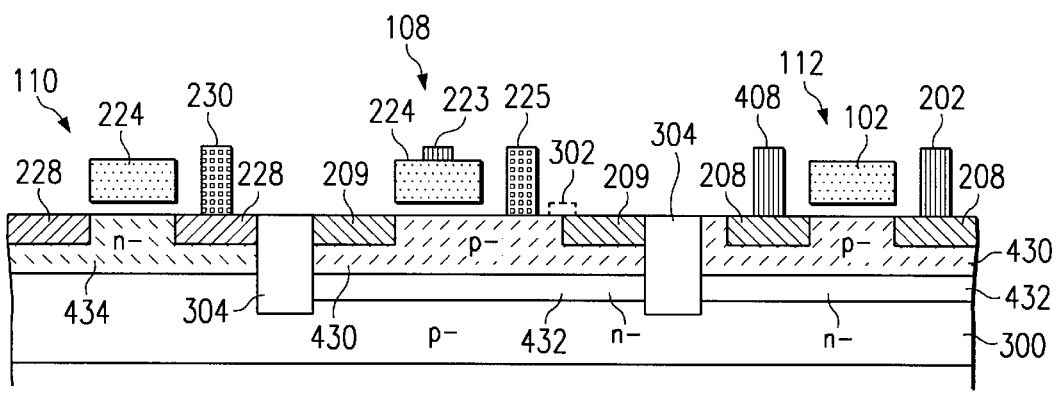
Figure 7B:
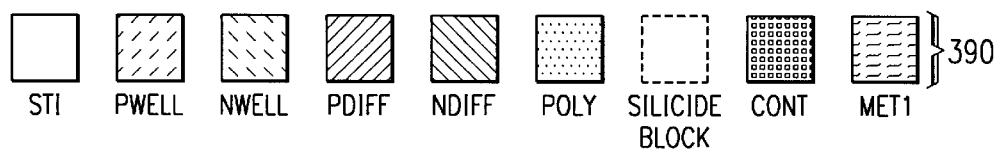

Referring to the embodiments of FIGS. 4a and 4b and 7a and 7b, which differ in that FIGS. 4a and 4b are based on the SRAM device of FIG. 1 and FIGS. 7a and 7b are based on the SRAM device of FIG. 5 which utilizes Schottky diodes in the backgate/body connections. Hence, the difference between the two embodiments is the composition (dopant levels and possibly the dopant, but not dopant type, and whether there is silicidation) of regions 126, 248, 244 and 246. This can be seen in FIG. 7b where contact 225 connects to p-type well 430 instead of p-type diffusion 126. These two embodiments differ from the embodiment of FIG. 2 in that region 208 of FIG. 2 is split into two regions (208 and 209) in FIGS. 4a–4b and 7a–7b. In addition, doped region 228 and 236 abut oppositely doped regions 208 and 210, respectively, in the embodiment of FIG. 2, but in the embodiments of FIGS. 4a–4b and 7a–7b these regions are separated by the isolation regions. In order to connect these oppositely doped regions in the embodiments of FIGS. 4a–4b and 7a–7b, conductors 218 and 234 include additional conductive elements (such as conductors 402, 414, and 418) and additional interconnections (such as 223, 225, 241, 243, 402, 404, 406, 408, 412, and 416). In other words, conductors 410 and 414 and interconnections 406, 408, 412 and 220 are needed so as to interconnect doped regions 208 and 209 and 210 and 211 whereas in the other embodiment they were a single continuous structure. Interconnections 223 and 225 and 241 and 243 provide backgate connections so as to provide the desired threshold voltage control of the instant invention. Preferably, regions with similar cross-hatching are formed at the same time, using the same materials. Preferable materials 390 for each structure is illustrated beneath FIGS. 4b and 4b. However, other materials or dopants may be used. Deep well regions (such as well regions 432) are preferably more lightly doped then shallower well regions (such as p-wells 430 and n-wells 434), and these shallower wells are, preferably, more lightly doped then the p-type diffusions (such as regions 126, 228, and 246) and n-type diffusions (such as regions 208, and 209), which are, preferably, formed during the source/drain implantation steps. The same is true with the embodiments of FIGS. 2, 3a–3b, and 6a–6b.

A silicide blocking layer is provided during processing so as to block the formation of a silicide in regions 302. This is desirable so that junction between two differently doped regions is not shorted by the suicide.

In an alternative embodiment backgate/body connection 118 is connected to node 116 while backgate/body connection 114 is not connected to the gate of transistor 108. Similarly, in another embodiment backgate/body connection 138 is connected to node 117 while backgate/body connection 142 is not connected to the gate of transistor 130. In another alternative embodiment, the backgate/body connection of transistor 110 can be tied to line 122. In another embodiment, the backgate/body connection of transistor 128 is connected to line 120. In each of these alternative embodiments, they can be formed in conjunction with each other, separate of each other, in conjunction with each other but without making any connections to backgate/body connections 142 and/or 114 (to lines 120 and 122, respectively, and without connections to their respective gates), or done separate each other and without back any connections to backgate/body connections 114 and 142.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A memory device comprising:
    a memory cell including:
        a first transistor having a control electrode, a current path, and a backgate/body connection electrically connected to said control electrode of said first transistor; and
        and a second transistor having a control electrode, a current path, and a backgate/body, connection electrically connected to said control electrode of said second transistor and said current path of said first transistor, said current path of said second transistor connected to said backgate/body connection of said first transistor;
    an input/output conductor; and
    a pass transistor coupling said memory cell to said input/output conductor.

2. The memory device of claim 1, wherein said memory cell further includes:
    a third transistor having a control electrode and a current path electrically connected to said current path of said first transistor and said backgate/body connection and control electrode of said second transistor, said control electrode of said third transistor electrically connected to said current path of said second transistor and said control electrode and backgate/body connection of said first transistor; and
    a fourth transistor having a control electrode and a current path electrically connected to said current path of said second transistor, said control electrode of said third transistor, and said backgate/ body connection and said control electrode of said first transistor, said control electrode of said fourth transistor electrically connected to said current path of said first transistor, said current path of said third transistor, and said control electrode and said backgate/body connection of said second transistor.

3. The memory device of claim 1, wherein said backgate/body of said first transistor is electrically connected to said control electrode of said first transistor by a first diode.

4. The memory device of claim 1, wherein said backgate/body of said transistor is electrically connected to said control electrode of said second transistor by a second diode.

5. The memory device of claim 3, wherein said first diode is a Schottky diode.

6. The memory device of claim 4, wherein said second diode is a Schottky diode.

7. The memory device of claim 1, wherein said pass transistor has a backgate/body connection electrically connected to said current path of said first transistor, said current path of said third transistor, said control electrode of said second transistor, and said control electrode of said fourth transistor.

* * * * *